(12) United States Patent
Vermeeren et al.

(10) Patent No.: US 8,461,936 B2
(45) Date of Patent: Jun. 11, 2013

(54) MEMS OSCILLATOR

(75) Inventors: Petrus Antonius Thomas Marinus Vermeeren, Eindhoven (NL); Kim Phan Le, Eindhoven (NL)

(73) Assignee: NXP B.V., Eindhoven (NL)

( * ) Notice: Subject to any disclaimer, the term of this patent is extended or adjusted under 35 U.S.C. 154(b) by 26 days.

(21) Appl. No.: 13/198,067

(22) Filed: Aug. 4, 2011

(65) Prior Publication Data
US 2012/0032747 A1    Feb. 9, 2012

(30) Foreign Application Priority Data

Aug. 5, 2010   (EP) .................................... 10172068

(51) Int. Cl.
*H03B 5/30* (2006.01)
*G04C 3/06* (2006.01)

(52) U.S. Cl.
USPC ................. 331/154; 331/116 R; 331/116 M; 331/155

(58) Field of Classification Search
USPC .......................... 331/116 R, 116 M, 154, 155
See application file for complete search history.

(56) References Cited

U.S. PATENT DOCUMENTS

| 6,236,281 | B1 * | 5/2001 | Nguyen et al. | 331/154 |
| 2005/0073078 | A1 * | 4/2005 | Lutz et al. | 267/136 |
| 2006/0192463 | A1 * | 8/2006 | Cho et al. | 310/351 |
| 2009/0153258 | A1 * | 6/2009 | Lutz et al. | 331/156 |

FOREIGN PATENT DOCUMENTS

| WO | 2004/053431 A2 | 6/2004 |
| WO | 2008/149298 A1 | 12/2008 |
| WO | WO 2008149298 A1 * | 12/2008 |
| WO | 2009/066203 A1 | 5/2009 |
| WO | WO 2009066203 A1 * | 5/2009 |
| WO | 2010/044058 A1 | 4/2010 |

OTHER PUBLICATIONS

Phan et al, Piezoresistive Ring-Shaped MEMS Resonator, Oct. 13, 2009, Solid-State Sensors, Actuators and Microsystems Conference, 2009. Transducers 2009. International, 1413-1416.*
Extended European Search Report for European Patent Appln. No. 10172068.8 (Mar. 4, 2011)xxx.

* cited by examiner

*Primary Examiner* — Ryan Johnson
*Assistant Examiner* — Christian L Rivera

(57) ABSTRACT

A piezoresistive MEMS oscillator comprises a resonator body, first and second drive electrodes located adjacent the resonator body for providing an actuation signal; and at least a first sense electrode connected to a respective anchor point. The voltages at the electrodes are controlled and/or processed such that the feedthrough AC current from one drive electrode to the sense electrode is at least partially offset by the feedthrough AC current from the other drive electrode to the sense electrode.

14 Claims, 7 Drawing Sheets

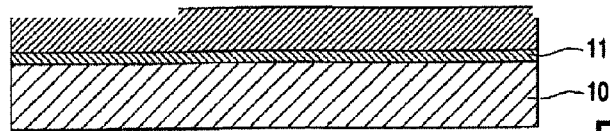
Fig.2A - PRIOR ART
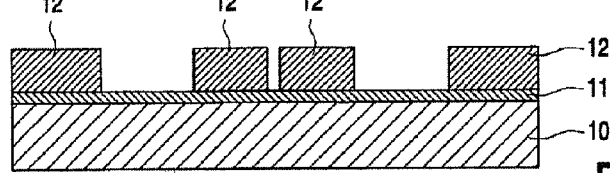
Fig.2B - PRIOR ART
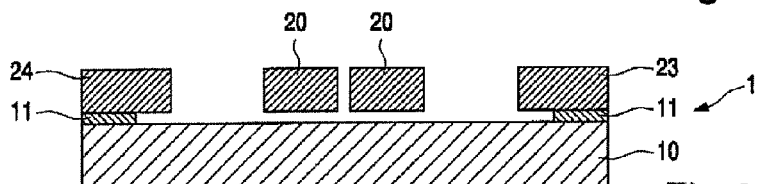
Fig.2C - PRIOR ART
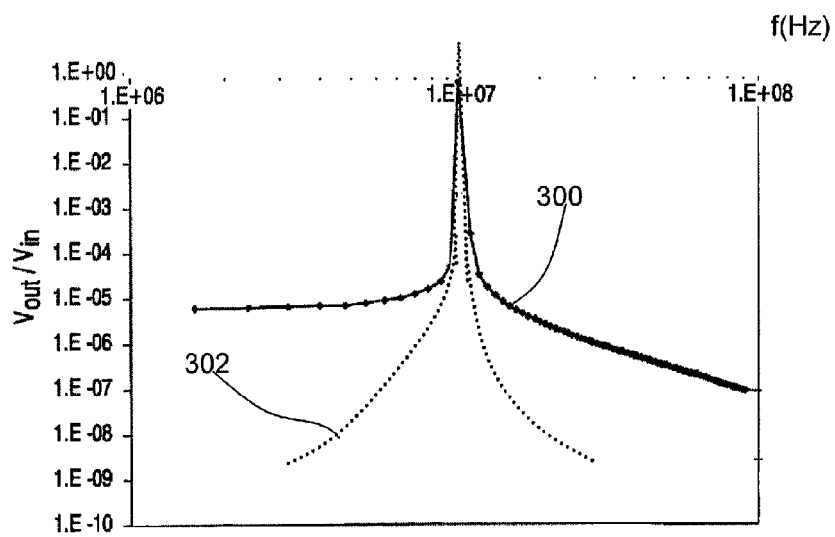
Fig.3 - PRIOR ART
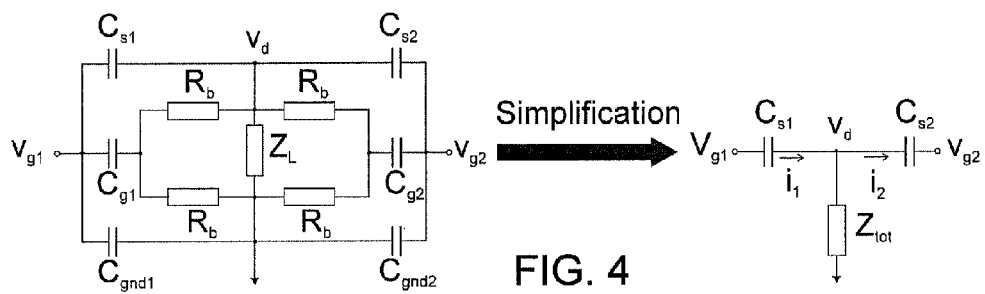
FIG. 4
PRIOR ART

MEMS OSCILLATOR

This application claims the priority under 35 U.S.C. §119 of European patent application no. 10172068.8, filed on Aug. 5, 2010, the contents of which are incorporated by reference herein.

FIELD OF THE INVENTION

This invention relates to MEMS oscillators, for example for generating clock signals or reference frequency signals.

BACKGROUND OF THE INVENTION

Electronic components inside flat objects, such as tags, bank cards or ID cards require a low profile of typically less than 0.5 mm. It is anticipated that flat, low-cost, and low power real time clocks (RTCs) and frequency reference oscillators (RFOs) are required residing inside these flat objects for future applications in the e-security, pharmaceutical, and food industry. An oscillator comprises a resonator and a feedback amplifier circuit, which are connected in a closed feedback loop. State-of-the-art RTCs make use of quartz crystal resonators with a height profile that typically exceeds the allowed sub-mm specification needed for their incorporation into flat products like cards, tags, and sheets of (value) paper. The main reason for this is because the packaging technology being used to encapsulate the quartz crystal does not lend itself well to miniaturization.

Furthermore, quartz resonators cannot be integrated easily on a Si chip. Therefore, the integration of a complete oscillator consisting of the crystal and amplifier cannot be realized on a single chip and further prohibits the miniaturization of RTCs and RFOs. In contrast, a MEMS resonator can be processed and packaged using surface micro-machining techniques and can be integrated with the amplifier circuit to form a very small form-factor oscillator.

Surface micro-machining is a technique whereby freestanding and moveable structures are made on top of a substrate using thin film deposition and etching techniques. In this way, both the resonator and its package can be processed on top of e.g. a Si wafer. The packaged resonator has a height of only several thin films measuring about 10 μm in total thickness. Furthermore, surface micro-machining allows for the definition of many thousands of packaged resonators onto a single wafer without making use of expensive assembly steps. The production cost associated with micro-machining decreases when the area occupied by a single device decreases. In this way, miniaturization of the resonator also has cost advantages. For quartz resonators, the production cost increases when the size of the resonator decreases as a result of the assembly-like production process that is being used.

MEMS-resonator based oscillators thus allow for low profile and low cost clocks and oscillators. However, they do not necessarily consume little power. Piezoresistive MEMS resonators require a body DC bias-current & a DC polarization voltage for their electrode. The body of a piezoresistive resonator is fed a DC-current. By applying an AC-signal to an attached but isolated electrode ('gate') the resistivity of the body is modulated, so a signal-voltage develops. This takes place in a narrow frequency-region for proper operation.

Parasitic capacitances resulting from the physical layout cause undesired conduction paths through the structure, for example a feedthrough path from the drive electrodes to the sense electrodes. These limit the performance of the oscillator and increase the power consumption.

Low power consumption and high performance are often conflicting requirements: to obtain amplitude selectivity that exceeds the signal transfer caused by the inherent capacitive feedthrough path, more bias and/or polarization are required. This increases power consumption. Power consumption can be lowered and/or amplitude selectivity can be increased if the capacitive feedthrough path can be eliminated or at least be reduced.

SUMMARY OF THE INVENTION

According to the invention, there is provided a piezoresistive MEMS oscillator comprising:

a resonator body which comprises a resonator mass part, a piezoresistive sensor part, and at least one anchor point;

first and second drive electrodes located adjacent the resonator body for providing an actuation signal;

at least a first sense electrode connected to a respective anchor point; and control circuitry for controlling the voltages applied to the electrodes and for processing the signals measured at the first sense electrode to derive the oscillator output signal, wherein the control circuitry is adapted to control the voltages applied to the electrodes and process the signals measured at the sense electrode such that the feedthrough AC current from one drive electrode to the sense electrode is at least partially offset by the feedthrough AC current from the other drive electrode to the sense electrode.

This oscillator design uses the signals applied or measured to provide offsetting of the effect of parasitic capacitances in the resonator. In particular, the voltage coupling caused by the capacitance between the two drive electrodes and the sense electrode is balanced. This balancing means that feedthrough currents through these parasitic capacitances at least partially cancel each other out.

The invention can be applied to piezoresistive oscillators generally. In one example, the resonator body comprises an elongate structure having a pair of parallel connection arms between first and second end regions, wherein the connection arms each have an anchor point;

the first and second drive electrodes are located adjacent the first and second end regions, respectively, for providing actuation signals;

a second sense electrode is provided, with the first and second sense electrodes connected to the anchor points of the first and second connection arms, respectively.

This defines a double-beam dog-bone shaped resonator.

In another example, the oscillator comprises comprising a ring having at least two piezoresistive portions defined at inner and/or outer portions of the ring between anchor points, with a sense electrode coupled to each anchor point, wherein at least first and second drive electrodes are located adjacent the inner and/or outer rims of the ring, for providing actuation signals; and at least one anchor point is provided with a sense electrode connected thereto.

This ring can have at least two piezoresistive portions with a sense electrode coupled to each anchor point, wherein at least first and second drive electrodes are located adjacent the piezoresistive portions, for providing actuation signals. Four anchor points can be provided, each having a sense electrode connected thereto.

In one example, the control circuitry is adapted to apply voltages of equal magnitude and opposite polarity to the drive electrodes with respect to a reference voltage. These opposite voltages thus result in a cancelled voltage offset at the anchor location.

The control circuitry can be adapted to apply voltages with opposite polarity to the drive electrodes with respect to a reference voltage, weighted in magnitude with respect to the capacitance between the respective drive electrode and the sense electrode. This provides a way to offset the effect of the parasitic capacitances even if they have different magnitude.

The control circuitry can be adapted to provide a DC current flow through the piezoresistive spring member (this can be achieved by applying voltages to the sense electrodes or using a current source to provide a current flow between the sense electrodes) and to measure a signal at the sense electrode (the measured signal can be a voltage or a current flow depending on the drive signals applied).

This provides voltage-actuated sensing or current-actuated sensing to derive the resonator output signal.

In another arrangement, the control circuitry is adapted to provide a current flow between two sense electrodes and to measure a signal difference between two sense electrodes, such as a voltage difference.

For example, this can provide current-biased sensing to derive a resonator differential output voltage signal.

The control circuitry can be adapted to apply equal voltages to the drive electrodes and to measure a differential signal between the two sense electrodes. This provides a differential sensing method, again to provide cancellation of the effects of parasitic capacitances, but while still enabling equal voltage profiles to be applied to the drive electrodes.

The differential sensing method can be combined with the opposite drive signal approach.

The invention also provides a method of controlling a piezoresistive oscillator, comprising:

applying voltages to drive electrodes located adjacent a resonator body which comprises a resonator mass part, a piezoresistive sensor part, and at least one anchor point;

processing the signal at a sense electrode which is connected to an anchor point of the resonator body, wherein the voltages applied to the drive electrodes and the processing of the signal measured at the sense electrode are selected such that the feedthrough AC current from one drive electrode to the sense electrode is at least partially offset by the feedthrough AC current from the other drive electrode to the sense electrode.

BRIEF DESCRIPTION OF THE DRAWINGS

Examples of the invention will now be described with reference to the accompanying drawings, in which:

FIG. 2 shows in simplified form how the resonator of FIG. 1 is manufactured;

FIG. 3 shows the frequency selectivity of the device of FIG. 1, and additionally shows the frequency selectivity achieved by the invention;

FIG. 4 shows an equivalent circuit for the capacitances in the structure of FIG. 1, as well as a simplified version;

DETAILED DESCRIPTION OF EMBODIMENTS

Figure 1:
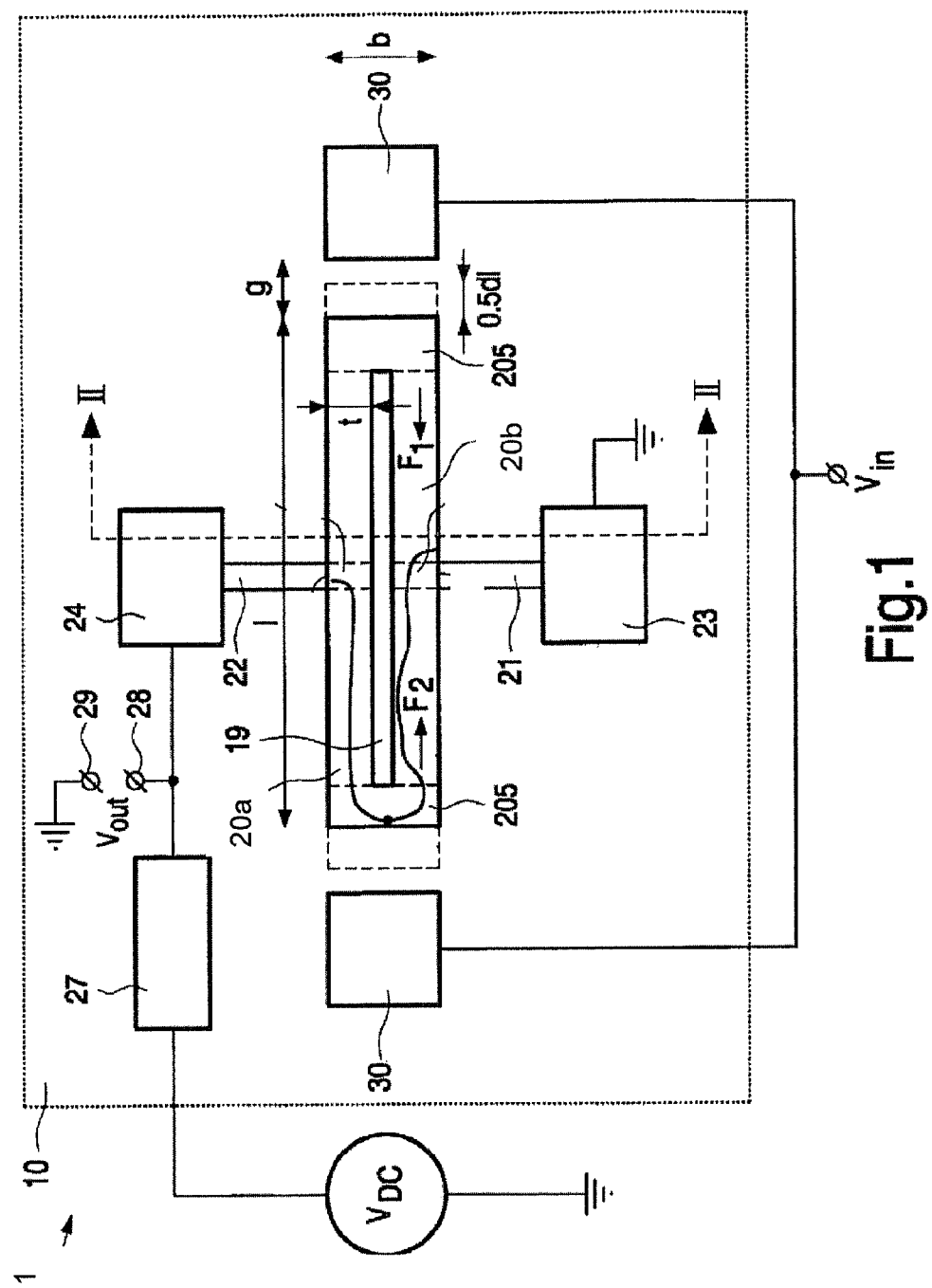
FIG. 1 shows a known piezoresistive MEMS resonator and biasing details.

FIG. 1 shows a known piezoresistive MEMS resonator, which is described in more detail in WO 2004/053431.

The resonator 1 shown in FIG. 1 comprises a substrate 10 which is a silicon wafer. Alternatively, substrate 10 may be a gallium arsenide wafer or it may comprise any other semi-conducting, metal or dielectric material. For resonators 1 designed for operation at frequencies above 10 MHz it is advantageous to use a substrate 10 comprising a dielectric such as, e. g., glass, because this reduces the loss of electromagnetic energy dissipated in the substrate.

The resonator 1 further comprises an electrically conductive resonator element 20 having two parallel connecting elements 20a,20b. The resonator extends in a longitudinal direction having a length l, for operation in bulk mode. It is attached to the substrate 10 via support elements 21 and 22 which are connected to anchor elements 23 and 24, respectively. The anchor elements 23 and 24 are affixed to the substrate 10 as is shown in FIG. 2C. The resonator element 20 and the support elements 21 and 22 are free from the substrate 10 except for the connection via the anchor elements 23 and 24.

The resonator may be manufactured using a technique well known in the field of micro electromechanical systems (MEMS). In short, the substrate 10 is first provided with an oxide layer 11 on top of which a silicon layer 12 is deposited, shown in FIG. 2A.

The silicon layer 12 is covered by a photosensitive resist, not shown, which is patterned by, e.g. lithography. The patterned resist is then developed yielding the surface areas of the resonator element 20, the support elements 21 and 22, the anchor elements 23 and 24, and the actuator 30 shown in FIG. 1 covered by the resist while the remaining part of the surface is free from resist. The surface partly covered by the resist is then subjected to etching which selectively removes those parts of the silicon layer 12 that are not covered by the resist. The result of the etching is shown in FIG. 2B. Subsequently, the oxide layer 11 which is exposed due to the previous etching is etched in a second etching step. This etching step removes all exposed parts of oxide layer 11 and, moreover, some of the oxide adjacent to these parts. As a result of the second etching step, the central parts of silicon layer 12 in FIG. 2C are free from the substrate. They form the resonator element 20. At the same etching step, the oxide layer 11 under the support elements 21 and 22 is also removed such that the resonator element 20 is attached to the substrate 10 only via the anchor elements 23 and 24.

The resonator element 20 has two outer ends 205 in the longitudinal direction. These can be larger than the combined width of the connecting beams 20a,20b and spacing 19 to define wider resonator masses at the ends, and thereby define a so-called dog-bone shape.

Each of the outer ends 205 is faced by a respective electrode of the electrically conductive actuator 30, and is spaced from the electrode by an actuation gap g. The actuators can be considered to be gate terminals, in that the control input is applied to these terminals. The actuator 30 is able to receive an actuation potential difference $V_{IN}$ with respect to the resonator element 20 for elastically deforming the resonator element 20, using the electrostatic force. The actuation potential difference is a function of the input signal applied to the resonator 1. In addition to the input signal the actuation potential difference may typically further contain a DC component.

The elastic deformation comprises a change of the length l by an amount dl shown in FIG. 1.

The resonator element 20 is part of an oscillator circuit which is able to conduct an electrical current through the resonator element 20. The resonator element 20 is electrically connected to the positive or negative pole of a DC voltage source $V_{DC}$ via an auxiliary resistor 27, the anchor element 24 and the support element 22. The anchor 24 can be considered to be a drain terminal in that the DC voltage bias is applied to this terminal to drive a bias current through the device. The resonator element 20 is further connected to ground via the support element 21 and the anchor element 23. The anchor 23 can be considered to be a source terminal in that the bias current is collected at this terminal. Therefore, the resonator element 20 is able to conduct an electrical current I. It constitutes a resistor with an ohmic resistance R which causes a voltage drop V when the resonator element 20 conducts the electrical current I.

The resonator element 20 constitutes a resistor with an ohmic resistance R which is a function of the change dl of the length l because the resonator element 20 comprises a central part 19 with open space. The resonator element 20 comprises the two mutually parallel beams 20a, 20b each of which is affixed to a respective support element 21 and 22. The two beams are connected with each other at the two outer ends by elements 205. The central part 19 has been created during the lithography step and the etching step described above. It prevents the current from flowing from the support element 22 to the support element 21 in a straight line. The current has to follow the conductive path formed by the resonator element 20. This conductive path extends in the longitudinal direction.

The circuit is able to produce an output signal which is a function of the change dl of the length l and which is a function of the resistance R. To this end the circuit comprises a measurement point 28 which is electrically connected to the circuit. It is situated between the auxiliary resistor 27 and the anchor element 24, and in operation it produces an electrical output signal which is the electrical potential difference Vout between the measurement point 28 and the reference point 29 which is connected to ground.

In an alternative embodiment, not shown, the auxiliary resistor 27 is not situated between the voltage source and the anchor element 24, but instead between the anchor element 23 and ground. In this case the measurement point 28 is situated between the auxiliary resistor 27 and the anchor element 23.

In yet another embodiment, not shown either, the DC voltage source $V_{DC}$ and the auxiliary resistor 27 are omitted. The anchor element 24 is connected to the positive pole of a current source and the anchor element 23 is connected to the negative pole of the current source. The measurement point 28 is situated between the positive pole of the current source and the anchor element 24, and the reference point 29 is situated between the anchor element 23 and the negative pole of the current source. Thus, a voltage is measured for a constant current, or else a current portion is measured for a constant total voltage.

The output signal is again a function of the change dl of the length l as will be understood by those skilled in the art. Thus, sensing using current bias or voltage bias can be employed.

The resulting mechanical resonance is in-plane of the drawing and is symmetrical. As mentioned above, the left and right parts of the resonator can be enlarged to define masses of relatively larger stiffness than the intermediate beams, so the compression and expansion that cause the resonator-vibration occurs in the beams.

Since the mechanical vibration is symmetrical, the centre of the structure between the drain and source 24, 23 remains mechanically fixed as well.

The so called actuation-gap on each side is located between the gate electrodes 30 and the resonator mass and is in the order of a few hundred nm.

FIG. 3 shows as plot 300 the frequency response for the standard drive approach for the circuit of FIG. 1.

There is a capacitive feedthrough path between the gates 30 and drain/source 24, 23.

FIG. 4 shows equivalent AC circuits of the resonator in FIG. 1, taking into account feedthrough capacitances Cs1 and Cs2. The left circuit is a complete circuit representation and the right circuit is a simplified version.

The total resonator feedthrough-capacitance Cs is built up from contributions of the gap capacitance Cg1, Cg2 and the other shown capacitances resulting from the capacitances to and from the imperfectly grounded substrate. For the arrangement where the lower resonator-body connection is grounded, the capacitances Cs1 & Cs2 between the gate electrodes and the drain terminal 24 (Vd) are the dominant contributions to the capacitive-feedthrough.

These parasitic capacitances result in additional power consumption and the capacitive feedthrough path also has the effect of reducing the magnitude of the resonant peak of the resonator. The distance between peak-height and background is the amplitude selectivity.

While indeed the height of the resonant peak decreases, the absolute height of the transfer at the peak location remains about the same: it is the 'base'/'background' (the height of the slope from which the resonance-peak arises) that increases due to more capacitive feedthrough.

In the known arrangement of FIG. 1, both gates carry the same signal (Vin), and they are electrically connected together as shown.

The invention provides designs in which the influence of the capacitive feedthrough can be removed or at least significantly be reduced by using the same resonator-structure in a modified configuration. The feedthrough currents resulting from different parasitic capacitive couplings are caused to cancel each other, at least partially.

A first example of approach of the invention is to make each connection of the two originally interconnected gates available separately and drive them by signals with opposite polarity, both for the DC-polarization and the AC-signals.

For such an arrangement, two identical feedthrough currents but of opposite sign arrive at the resonator output (drain node 24). This arrangement can be considered to have balanced driving (in that the capacitive coupling of the drive signals is balanced so that the voltage effect is cancelled) and unbalanced sensing. As a result, the net feedthrough is cancelled/reduced.

The cancellation principle can be explained using FIG. 4.

In FIG. 4, only the AC components of the capacitive feedthrough currents are considered. $v_{g1}$ and $v_{g2}$ are AC actuation signals applied at the electrodes. The actuation signals have the same frequency $\omega$, but may have different phase. $v_d$ is the AC voltage at the drain node. $Z_L$ is the impedance of the load, which is the readout circuit of the oscillator. $R_b$ is the resistance of each beam of the connecting element 20a, 20b. Due to the symmetry of the resonator body, the beams of the connecting elements have the same resistance. In the simplified circuit $Z_L$ and $R_b$ are in parallel, resulting in $Z_{tot}$. $C_{g1}$ and $C_{g2}$ are much smaller than $C_{s1}$ and $C_{s2}$, and therefore are ignored in the simplified circuit.

The useful signal that is desired at the drain node is the AC signal corresponding to the change dl in strain, which is highly frequency dependent: it shows a sharp peak at the resonant frequency of the resonator body. At the drain node, besides the actual useful signal coming from the change in strain (not shown in FIG. 4), there is a parasitic voltage $v_d$ induced by feedthrough currents $i_1$ and $i_2$ coming from the actuation electrodes, through the parasitic feedthrough capacitances $C_{s1}$ and $C_{s2}$. The feedthrough-induced voltage $v_d$ does not contribute to the resonant signal, therefore deteriorates the frequency selectivity of the signal (i.e. the background around the peak in the frequency response curve increases, thus the resonance peak height is reduced). For this voltage $v_d$ to be equal to zero, no net current should be able to flow into $Z_{tot}$ and develop a voltage across it. So the following must hold:

$$j\omega C_{s1}*(v_{g1}-v_d)=j\omega C_{s2}*(v_d-v_{g2}) \quad [1]$$

This is based on Kirchhoffs current law applied to the drain-node.

By assuming that $C_{s1}=C_{s2}=C_s$, which is likely true due to the symmetry of the resonator body, and with a condition that $v_{g1}=-v_{g2}=v_g$, Equation [1] can be simplified to the following relationships:

$$j\omega C_s*(v_{g1}-v_d)=j\omega C_s*(v_d+v_{g2}) \quad [2]$$

$$(v_g-v_d)=(v_d+v_g) \quad [3]$$

$$v_d=0$$

This shows that for perfect symmetry and actuation signals of opposite signs, the capacitive feedthrough is eliminated ($v_d=0$) and the resonator amplitude selectivity is improved.

Thus, a first implementation of the invention provides the application of equal and opposite AC voltages to the drive electrodes with respect to a reference voltage. In the equations above, the reference voltage is zero—however, this is not necessarily the case, as symmetrical voltages can be provide around a non-zero reference voltage. In practice, improvements of resonance peak height of up to 25 dB have been measured.

Figure 5A:
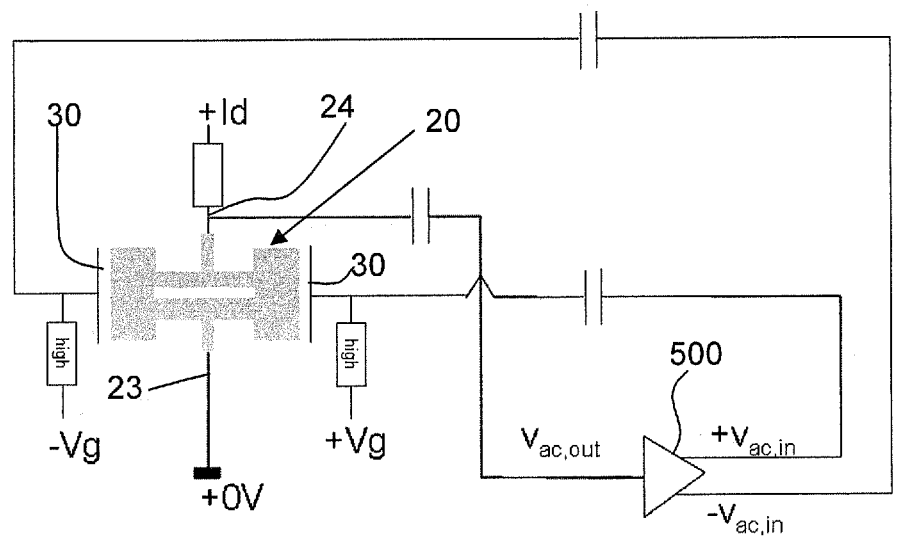
FIGS. 5A-C show three examples of drive and sense scheme of the invention applied to a resonator of the type shown in FIG. 1.

This first implementation of a balanced drive (but unbalanced sensing) is shown in FIG. 5A, and with a non-zero DC reference voltage.

FIG. 5A shows the resonator body 20. A DC bias-current through the resonator body is realized by connecting a current source to the drain 24. As shown, opposite DC voltages +Vg and −Vg are applied to the gate electrodes 30 as well as opposite AC voltages $+v_{ac,in}$ and $-v_{ac,in}$. Here, the DC voltages are referred to the middle point 30 of the electrodes. The sensing is based on the AC voltage at the drain. As shown, a differential amplifier 500 provides the differential (balanced) driving, When a combination of DC and AC voltages are applied at the actuation electrodes, the mechanical vibration is caused by the electrostatic actuation force across each actuation-gap (between electrode & mass) and is for each gap given by:

$$F_{el-f} \approx \frac{\varepsilon_0 A}{g^2}\left(V_g v_g \cos\omega t + \frac{V_g^2}{2}\right) \quad [4]$$

where A is the electrode area and g is the gap width; $\epsilon_0$ is the permittivity of vacuum.

From this equation it is clear that changing both the signs of $V_g$ and $v_g$ results in an identical actuation force as for the original configuration, hence the mechanical vibration mode remains completely unchanged for the modified arrangement.

As a consequence, the described method of balanced resonator-drive combines improved electrical resonator-behaviour with maintained mechanical-behaviour (as desired).

As mentioned above, FIG. 3 shows as plot 300 the frequency response for the standard drive approach for the circuit of FIG. 1. Plot 302 shows how the response is modified by using this embodiment of the invention. The height of the resonant peak is increased and the width is reduced, giving better frequency selectivity.

The invention is not restricted to a balanced drive and unbalanced sensing approach as explained above.

A drive scheme with interconnected gate drive electrodes (as in the prior art, which can be considered to be an unbalanced drive scheme) can also be used, if a differential sensing scheme is used. This differential sensing scheme can be considered to be a balanced sensing scheme, in that the effect of capacitive effects at the two anchor points is cancelled.

Figure 5B:
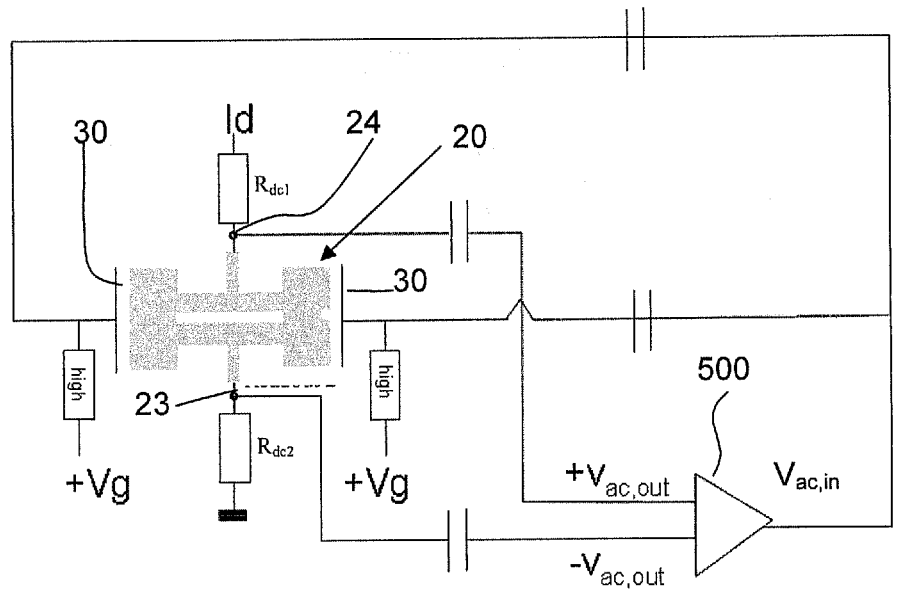

This approach is shown in FIG. 5B.

In this approach, the drain and source AC signals can be subtracted. The symmetry of the design means that the capacitive coupling to the drain 24 and source 23 are almost identical, so that the differential measurement cancels the effect of the capacitive feedthrough path. However, the signal at the drain and source vary oppositely. If the resistance of the resonator 20 drops, the voltage on the source 23 will rise and the voltage at the drain will fall as there is then a smaller resistance between them.

This approach involves applying equal voltages +Vg to the drive electrodes and measuring a differential voltage between the sense electrodes. Thus, this approach results in an improved situation as well: the capacitive feedthrough appears as a common-mode AC-signal while the desired signals appear with opposite polarities.

The approach described above for differential drive (balanced drive) can be combined with the approach described above for differential sensing (balanced sensing).

Figure 5C:
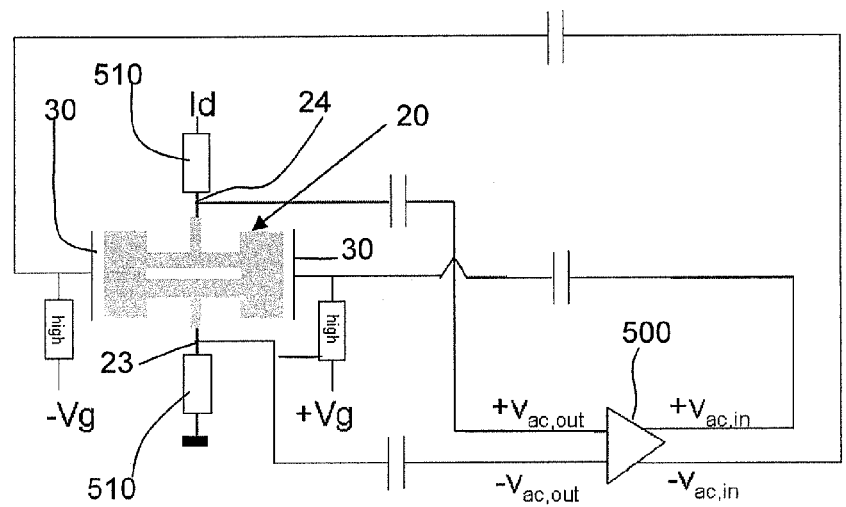

This approach is shown in FIG. 5C.

A DC bias-current through the resonator-body is realized by connecting equal resistors 510 (or current sources) between the supply rails and the anchor points 24,23. Due to the symmetry of the arrangement, the DC voltage at the outer ends 205 of the resonator body is 0.5 times the supply voltage $V_{dc}$. The differential amplifier 500 provides differential (balanced) sensing, as explained above. The drive electrodes are DC biased with opposite voltages +Vg and −Vg and with AC components of opposite polarity $+v_{ac,in}$ and $-v_{ac,in}$. This means the drive electrodes are provided with equal signal voltages of opposite sign at the outer ends 205.

Thus, FIG. 5C shows how to implement both the balanced drive and balanced sensing approach. As explained above, these two approaches may be used individually to provide the first two examples above, or they may be used in combination.

The configuration which is most suited depends on the requirements of the complete oscillator.

For example, the advantage of the conventional drive scheme with balanced sensing configuration is the requirement for only a single polarization polarity.

As also explained above, the sensing can either be voltage- or current-biased. For instance, current sensing can be employed, wherein a fixed voltage is applied to the piezoresistive element, and the current is measured. Whether voltage-biasing or current-sensing is used—or current-biasing in combination with voltage-sensing, depends on the requirements of the complete oscillator. Thus, in addition to the choice for one of the three balancing configurations shown in FIG. 5, the biasing/sensing approach provides further possibilities for adaptation to the requirements. For example, the amplifier stage 500 in FIG. 5 can either be applying voltage-amplification to the drain & source signals (voltage sensing) or can be providing virtual-earths at its input for current sensing (forming a transimpedance amplifier).

To obtain the largest reduction of the unwanted effect of capacitive feedthrough it is required that the provided signals are as accurately matched as possible.

However, even if there is non-perfect matching, the improvement can still be significant: more than 20 dB improvement in amplitude selectivity was measured in an experimental setup based on a resonator that had separated gates, but was otherwise not truly symmetrical.

Thus, even partially offsetting the capacitive coupling effect will give improved performance.

Compensation of any $C_{s1}$ vs. $C_{s2}$ unbalance is possible by adjusting the AC signal levels, so that the voltages are weighted with respect to the capacitance between the respective drive electrode and the sense electrode. In this case, only the AC component is weighted. The AC signal levels should be adjusted such that Eq. [5] below is satisfied.

This approach simply follows from equation [1] with $v_d=0$:

$$C_{s1} * v_{g1} = -C_{s2} * v_{g2} \qquad [5]$$

The invention has been described in detail with reference to a particular design of resonator. However, other resonator designs are possible. For example, a central resonator mass may have opposite anchored spring members on each side.

The resonator described above has bulk mode vibration, but the invention can be applied to flexural mode resonators as well.

In WO 2010/044058, a type of flexural mode piezoresistive resonator is described. The resonator has a shape of a ring, or a symmetrical polygon frame, such as a square frame. The structure has an in-plane mode shape in which segments of the structure alternatively bend inward and outward, while the width of the structure substantially remains unchanged. Anchors are positioned at the four quasi-nodal points of the mode shape, i.e. at the boundaries between the segments. An example of a ring-shaped resonator is given in FIG. 6. The flexural vibration mode shape is given in FIG. 7.

Figure 6:
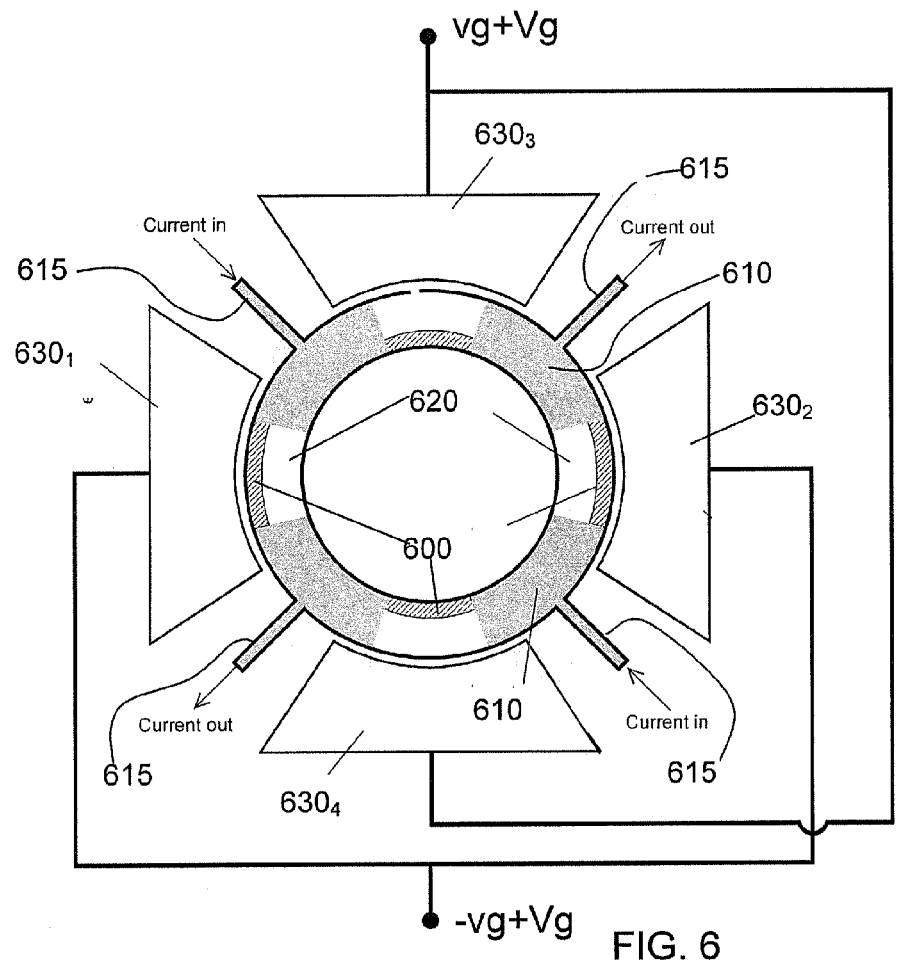
FIG. 6 shows a first example of drive and sense scheme of the invention applied to another type of resonator.

FIG. 6 shows the basic known resonator configuration from WO2010/044058, but also shows how the actuation electrodes are modified to implement the same conceptual cancellation of capacitive feedthrough.

Figure 7:
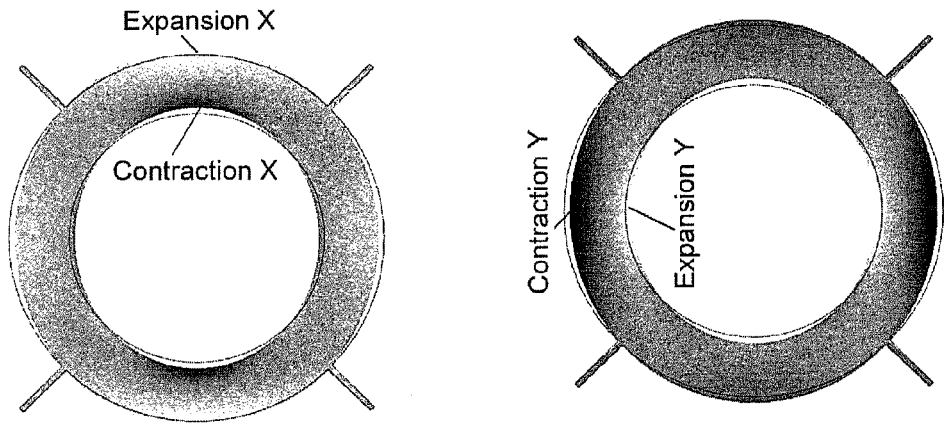
FIG. 7 shows how the resonator of FIG. 6 deflects.

FIG. 7 shows a finite element simulation showing the flexural ellipse mode shape of the ring-shaped resonator. The gray-scale coding indicates strain in the X (left picture) and Y (right picture) directions. During vibration, the inner and outer rims of consecutive segments contract and expand alternately.

At one or more locations on the structure, the Si material is locally doped (n- or p-type) to enable the piezoresistive effect. The piezoresistive regions are connected together and connected to the outside world via the anchors by highly doped regions (low resistance), or regions coated with metal layers. The connections are made in such a way that during vibration, the piezoresistive signal, being the change in resistance as a function of strain in the doped Si material, at different piezoresistive regions can be added up. During operation, a current is sent via the anchors, through the different piezoresistive regions to collect the piezoresistive signal. This signal is proportional to the deformation of the structure during its vibration. The vibration is excited by applying a combination of AC and DC voltages on the electrodes.

The left and right images of FIG. 7 show grey-scale maps of strain in the X, and Y directions, respectively. The light grey means expansion, and the dark grey-contraction. One can easily recognize that at every segment of the ring, the outer rim and the inner rim have opposite strain signs and the strain sign alternates from one segment to the next. For instance, the outer rim of the upper segment expands while the inner rim of the same segment contracts. At the same time, the outer rim of the next segment on the right side contracts while its inner rim expands, and so on.

To collect the piezoresistive signals due to strain induced in the structure, four regions 600 are locally doped with a suitable doping concentration (normally it is a relatively low concentration compared to the connection regions), as seen in FIG. 6. These regions, called the piezoresistive regions, should exhibit good piezoresistive effect. The piezoresistive regions are located at every segment of the ring and alternatively at the inner and outer rim, where the magnitudes of strain are maximum. The arrangement of the piezoresistive regions should be such that during vibration, they undergo strain with the same sign. The areas 610 in between the piezoresistive regions are doped with high concentration to make the material low ohmic. These low ohmic regions also extend to the anchors 615 and from the anchors to the outside world. The low ohmic regions 610 serve as the electrical connections between the piezoresistive regions and from these regions to the outside world.

These low ohmic regions therefore have no significant contribution to the piezoresistive signal. The rest of the ring area (such as area 620) should be left undoped, thus having very high resistance.

During operation, a sense current is sent through two opposite anchors and out through the other two opposite anchors. In this configuration, the four piezoresistive regions are connected in parallel and the sign of change in signals in all resistors are the same, thus the signals can be added up. The total piezoresistive signal change can be used as the output signal of the resonator, just as in the resonator described in FIG. 1. The "current-in" anchors can be considered the drain, and the "current-out" anchors can be considered the source.

Using the approach of the current invention, the ring-shaped resonator of WO 2010/044058 can be used in a different way, in order to cancel the effect of the feedthrough capacitance. In order to form the balanced drive configuration of the ring-shaped resonator, four actuation electrodes $630_1$ to $630_4$ are positioned at the outer rim of the ring structure, facing the four segments. This is shown in FIG. 6.

Alternatively, the electrodes $630_1$ to $630_4$ can be positioned facing the inner rim of the segments. The electrodes should be paired such that any two opposite electrodes are connected to each other. The two pairs of electrode are fed with AC voltages of opposite signs but DC polarization voltages of the same sign, as shown.

For example, as shown in FIG. 6, the top-bottom electrodes are fed with $+v_g+V_g$, while the left-right electrodes are fed with $-v_g+V_g$. According to Eq [4], the force that exerts on the top-bottom segments has opposite polarity compared to that exerting on the left-right segments. These anti-phase forces are required to drive the ring in the ellipse mode shape. On the other hand, the use of $v_g$ in opposite signs forms the balanced drive configuration, thus the feedthrough current is cancelled out. An advantage of this configuration over the balanced drive configuration of the dog-bone resonator in FIG. 1 is that only one DC polarization is needed, which makes the circuit design much easier, for a given limited voltage supply budget.

Figure 8:
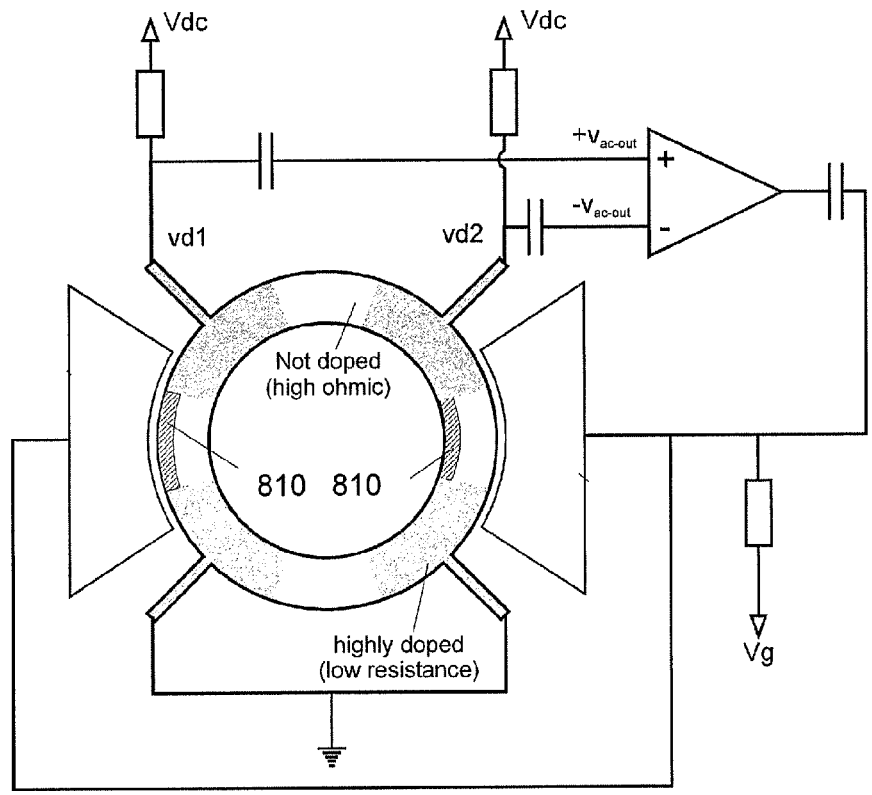
FIG. 8 shows a second example of drive and sense scheme of the invention applied to the type of resonator of FIG. 6.

The ring-shaped resonator can also be arranged to form the balanced sensing configuration. This is shown in the example of FIG. 8. The left and the right segments 810 are lowly doped at the outer and inner rim, respectively, to form two piezoresistive regions. The top and bottom regions are not doped, so that there are only two piezoelectric regions. The two segments have the same polarity in strain during a vibration cycle. However, because the piezoresistive regions are located in the opposite sides of the segments, they should result in signals with opposite polarity during a vibration cycle, which is $+v_{ac\text{-}out}$ and $-v_{ac\text{-}out}$. These differential signals are fed into a differential amplifier. In this way, the useful signal is amplified while the common mode feedthrough voltages are cancelled out in the same amplifier.

Figure 9:
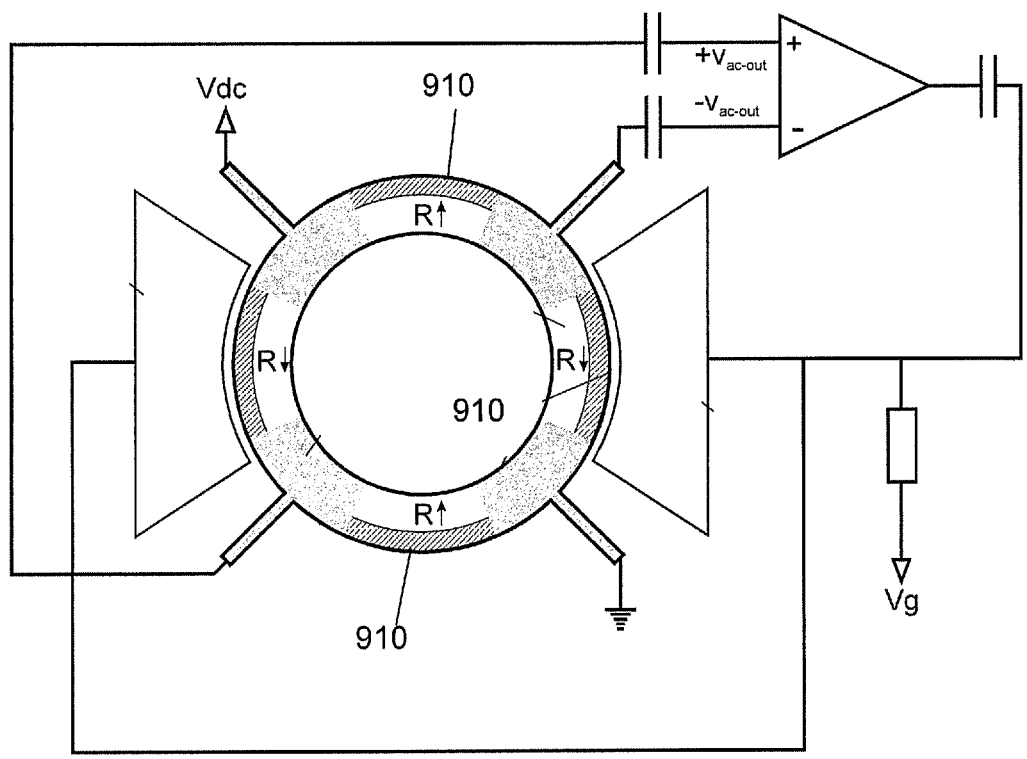
FIG. 9 shows a third example of drive and sense scheme of the invention applied to the type of resonator of FIG. 6.

Yet another example of balanced sensing configuration is given in FIG. 9. In this example, four piezoresistive regions 910 are positioned at the same rim of the ring, e.g. at the outer rim. As a consequence of the alternating bending directions of the ring segments, the four piezoresistive regions have alternating resistance changes during a vibration cycle. For example, during a cycle, resistances of the top and bottom segments increase while resistances of the left and right segments decrease. In other words, the ring forms a Wheatstone bridge configuration. When a constant DC voltage $V_{dc}$ is applied to an anchor, e.g. the top-left anchor, and the opposite anchor (e.g. bottom-right) is grounded, the other two anchors provide output signals of opposite polarity $+v_{ac\text{-}out}$ and $-v_{ac\text{-}out}$, which are fed into the differential amplifier, as in the previous example. The feedthough cancellation is also done in the same way.

Figure 10:
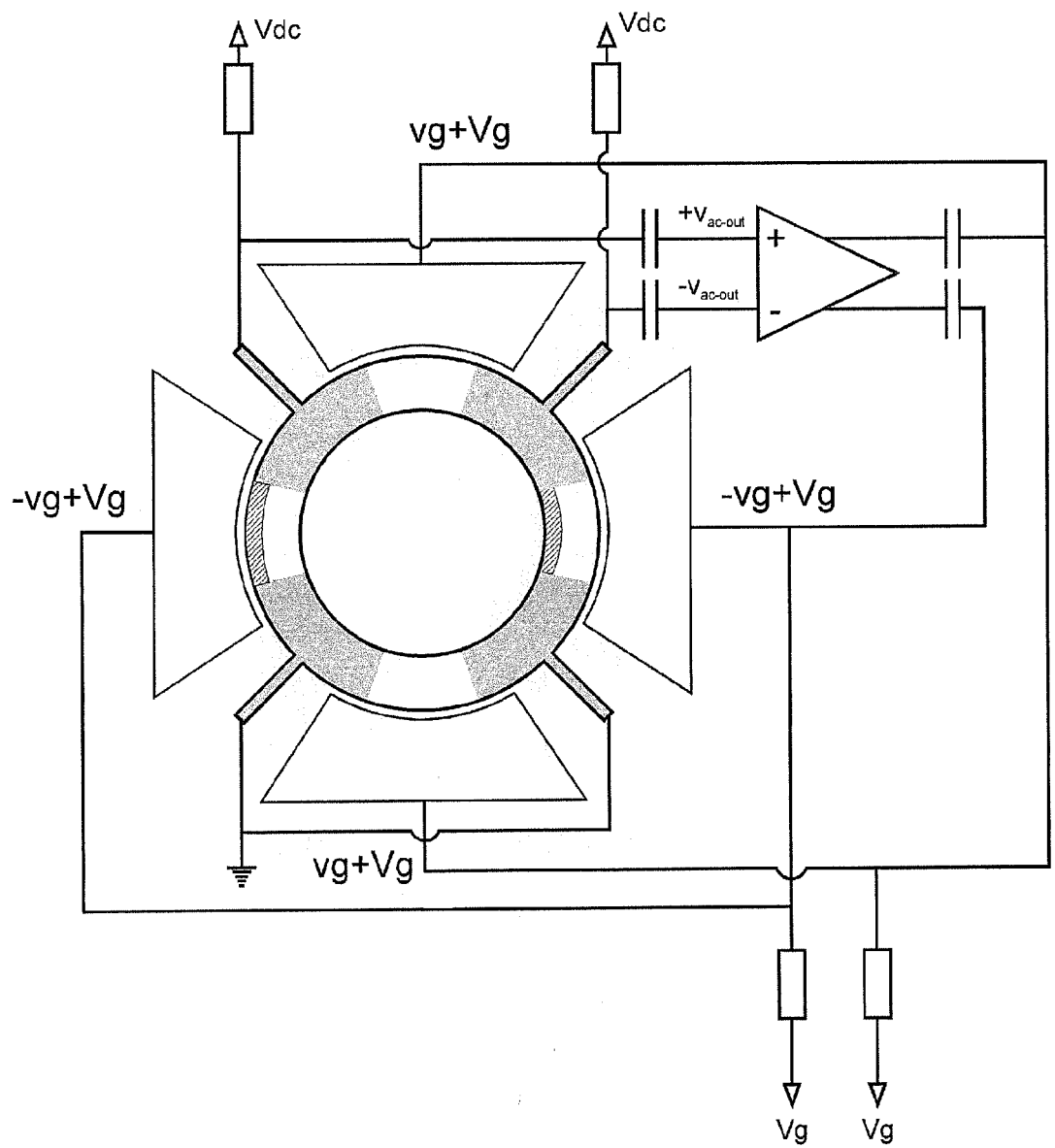
FIG. 10 shows a fourth example of drive and sense scheme of the invention applied to the type of resonator of FIG. 6.

Any combinations of balanced drive and balanced sensing (e.g. FIG. 6 with FIG. 8 or FIG. 6 with FIG. 9) are possible. An example of such a combination is given in FIG. 10, which shows a balanced drive—balanced sensing configuration for the ring-shaped resonator.

For the example of a dogbone resonator, the length may be 40 um, and the width of each beam around 3 um. The dimensions of a ring-shaped resonator may be an outer diameter of around 70 um, an inner diameter of around 48 um.

Vg is in the order of a few V up to a few tens of V; vg is in the order of mV up to a few hundreds of mV.

The actuation force has the same frequency $\omega$ as the drive AC voltage. By using a combination of $V_{drive}=V_g+v_g$, in which $v_g=v_{g0}*\cos \omega t$, and with a condition that $V_g \gg v_{g0}$, e.g $V_g$ in the order of a few V to a few tens of V, while $v_g$ is in the order of mV to a few tens of mV. An equation for the actuation force is:

$$F = \frac{\partial C}{\partial x} \frac{V_{drive}^2}{2}$$
$$= \frac{\partial C}{\partial x} \frac{V_g^2 + 2V_g v_{g0}\cos\omega t + v_{g0}^2\cos^2\omega t}{2}$$
$$= \frac{\varepsilon_0 A}{g^2} \frac{V_g^2 + 2V_g v_{g0}\cos\omega t + v_{g0}^2\cos^2\omega t}{2}$$

in which C is the capacitance across the actuation gap, x is the displacement of the ends of the resonator. In the above equation, the last term ($v_{g0}^2*\cos^2\omega t$), after a trigonometric change, is a function of double frequency $2\omega$. However, since the condition is that $V_g \gg v_{g0}$, and this term has the factor of $v_{g0}^2$, it is considered very small and ignored. The first term ($V_g^2$) is a DC component, therefore has no function in driving the vibration, can also be ignored. The rest is the middle term, which is a function of frequency $\omega$, is actually used to drive the vibration. This leads to equation [4] above.

In the balanced drive version, equal and opposite voltages are applied to the drive electrodes with respect to a reference value. For example, with $+Vg+v_{ac}$ and $-(Vg+vg_{ac})$ the reference is zero. With $+Vg+v_{ac}$ and $+Vg-v_{ac}$, the reference voltage is Vg.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A piezoresistive MEMS oscillator comprising:
a resonator body which comprises a resonator mass part, a piezoresistive sensor part, and at least one anchor point;
first and second drive electrodes located adjacent the resonator body for providing an actuation signal;
at least a first sense electrode connected to a respective anchor point; and
control circuitry for controlling voltages applied to the electrodes and for processing signals measured at the first sense electrode to derive an oscillator output signal, wherein the control circuitry is adapted to control the voltages applied to the electrodes and process the signals measured at the sense electrode such that a feedthrough AC current from one drive electrode to the sense electrode is at least partially offset by a feedthrough AC current from the other drive electrode to the sense electrode, by balancing the voltage coupling between the first and second drive electrodes and the sense electrode, wherein the control circuitry is adapted to, at least one of, drive a DC-bias current from the first sense electrode, through the resonator body to ground and derive the oscillator output signal from the sense electrode voltage, and apply equal and opposite dc voltages to the drive electrodes and opposite polarity ac voltages to the drive electrodes, and drive a DC-bias current from the first sense electrode, through the resonator body to ground, and derive the oscillator output signal from a voltage difference between the first sense electrode at which the DC-bias current is provided into the resonator body and a second sense electrode at which the DC-bias current is drained from the resonator body.

2. The oscillator as claimed in claim 1, wherein the control circuitry is adapted to apply equal and opposite voltages to the drive electrodes.

3. The oscillator as claimed in claim 1, wherein the control circuitry is adapted to apply opposite sign voltages to the drive electrodes, having an AC component which is weighted with respect to a capacitance between the respective drive electrode and the sense electrode.

4. The oscillator as claimed in claim 2, wherein the control circuitry is adapted to provide a DC current flow through the piezoresistive sensor part and to measure a signal at the sense electrode.

5. The oscillator as claimed in claim 1, wherein the first sense electrode and a second sense electrode are provided, and the control circuitry is adapted to apply equal voltages to the drive electrodes and to measure a differential signal between the two sense electrodes.

6. The oscillator as claimed in claim 1, wherein the first sense electrode and a second sense electrode are provided, and control circuitry is adapted to provide a DC current flow between the two sense electrodes, and to measure a differential signal between the two sense electrodes.

7. The oscillator as claimed in claim 1, wherein the resonator body comprises an elongate structure having a pair of parallel connection arms between first and second end regions, the connection arms each have an anchor point, the first and second drive electrodes are located adjacent the first and second end regions, respectively, for providing actuation signals, and the first sense electrode and a second sense electrode are provided, which are connected to the anchor points of the first and second connection arms, respectively.

8. The oscillator as claimed in claim 1, further comprising:
a ring having at least two piezoresistive portions defined at at least one of inner and outer portions of the ring between anchor points, with a sense electrode coupled to each anchor point, wherein at least first and second drive electrodes are located adjacent the inner and/or outer rims of the ring, for providing actuation signals; and
at least one anchor point is provided with a sense electrode connected thereto.

9. A method of controlling a piezoresistive oscillator, comprising:
applying voltages to first and second drive electrodes located adjacent a resonator body which comprises a resonator mass part, a piezoresistive sensor part, and at least one anchor point;
processing the signal at a sense electrode which is connected to an anchor point of the resonator body, wherein the voltages applied to the drive electrodes and the processing of the signal measured at the sense electrode are selected such that a feedthrough AC current from one drive electrode to the sense electrode is at least partially offset by a feedthrough AC current from the other drive electrode to the sense electrode, by balancing the voltage coupling between the first and second drive electrodes and the sense electrode, through at least one of driving a DC-bias current from the first sense electrode, through the resonator body to ground and deriving the oscillator output signal from the sense electrode voltage, and applying equal and opposite dc voltages to the drive electrodes and opposite polarity ac voltages to the drive electrodes, and driving a DC-bias current from the first sense electrode, through the resonator body to ground, and deriving the oscillator output signal from a voltage difference between the first sense electrode at which the DC-bias current is provided into the resonator body and a second sense electrode at which the DC-bias current is drained from the resonator body.

10. The method as claimed in claim 9, further comprising:
applying equal and opposite voltages to the drive electrodes.

11. The method as claimed in claim 9, further comprising:
applying opposite voltages to the drive electrodes, having an AC component weighted with respect to a capacitance between the respective drive electrode and the sense electrode.

12. The method as claimed in claim 9, further comprising:
applying equal voltages to the drive electrodes; and
measuring a differential voltage between two sense electrodes.

13. The method as claimed in claim 10, further comprising:
controlling the voltages applied to the sense electrode to provide a DC current flow through the piezoresistive portion; and
measuring a voltage at the sense electrode.

14. The method as claimed in claim 10, further comprising:
controlling the current flowing between two sense electrodes; and
measuring a voltage difference between the two sense electrode.

* * * * *